(12) United States Patent
Blumer

(10) Patent No.: US 7,260,368 B1
(45) Date of Patent: Aug. 21, 2007

(54) LINEAR AMPLIFICATION WITH NON-LINEAR COMPONENTS (LINC) MODULATOR AND METHOD FOR GENERATING OUT-PHASED SIGNALS FOR A LINC TRANSMITTER

(75) Inventor: Benny Blumer, Kfar-Saba (IL)

(73) Assignee: Intel Corporation, Santa Clara, CA (US)

( * ) Notice: Subject to any disclaimer, the term of this patent is extended or adjusted under 35 U.S.C. 154(b) by 495 days.

(21) Appl. No.: 10/408,135

(22) Filed: Apr. 7, 2003

(51) Int. Cl.
*H04B 1/02* (2006.01)

(52) U.S. Cl. ............ 455/108; 455/91; 455/102; 455/110; 455/552.1; 375/261; 375/300

(58) Field of Classification Search ......... 455/567, 455/566, 550.1, 108, 91, 102, 110, 552.1; 379/179
See application file for complete search history.

(56) References Cited

U.S. PATENT DOCUMENTS

| | | | | |
|---|---|---|---|---|
| 4,638,504 A * | 1/1987 | Salek | ............... | 381/16 |
| 6,044,279 A * | 3/2000 | Hokao et al. | ............... | 455/567 |
| 6,134,455 A * | 10/2000 | Corkum | ............... | 455/567 |
| 6,330,457 B1 * | 12/2001 | Yoon | ............... | 455/550.1 |
| 6,363,265 B1 * | 3/2002 | Ritter | ............... | 455/567 |
| 6,449,465 B1 * | 9/2002 | Gailus et al. | ............... | 455/126 |
| 6,708,044 B1 * | 3/2004 | Puknat et al. | ............... | 455/552.1 |
| 6,738,432 B2 * | 5/2004 | Pehlke et al. | ............... | 375/300 |
| 6,792,294 B1 * | 9/2004 | Kushita | ............... | 455/566 |
| 6,983,024 B2 * | 1/2006 | Ballantyne | ............... | 375/261 |
| 2002/0183019 A1 * | 12/2002 | Dent et al. | ............... | 455/108 |
| 2003/0022640 A1 * | 1/2003 | Sorrells et al. | ............... | 455/118 |
| 2004/0005869 A1 * | 1/2004 | See et al. | ............... | 455/102 |
| 2004/0185805 A1 * | 9/2004 | Kim et al. | ............... | 455/114.3 |

* cited by examiner

*Primary Examiner*—Nay Maung
*Assistant Examiner*—Richard Chan
(74) *Attorney, Agent, or Firm*—The Law Offices of John C. Scott, LLC

(57) ABSTRACT

Embodiments of a linear amplification with non-linear components (LINC) modulator and method for generating out-phased signals for a LINC transmitter are generally disclosed.

26 Claims, 6 Drawing Sheets

LINEAR AMPLIFICATION WITH NON-LINEAR COMPONENTS (LINC) MODULATOR AND METHOD FOR GENERATING OUT-PHASED SIGNALS FOR A LINC TRANSMITTER

TECHNICAL FIELD

The present invention pertains to transmitters, and in some embodiments, to linear amplification with non-linear components (LINC) modulators.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. Embodiments of the invention encompass the full scope of the claims and all available equivalents.

In embodiments, the present invention provides an improved LINC transmitter. In other embodiments, the present invention provides an improved LINC modulator. In other embodiments, the present invention provides a method for generating out-phased signals for use in a LINC transmitter. In embodiments, out-phased signals may be produced using less die area and with reduced current consumption. In some embodiments, the LINC modulator uses common-base transistors in a cascode configuration that may serve as both a current combiner and output buffer simultaneously.

Figure 1A:
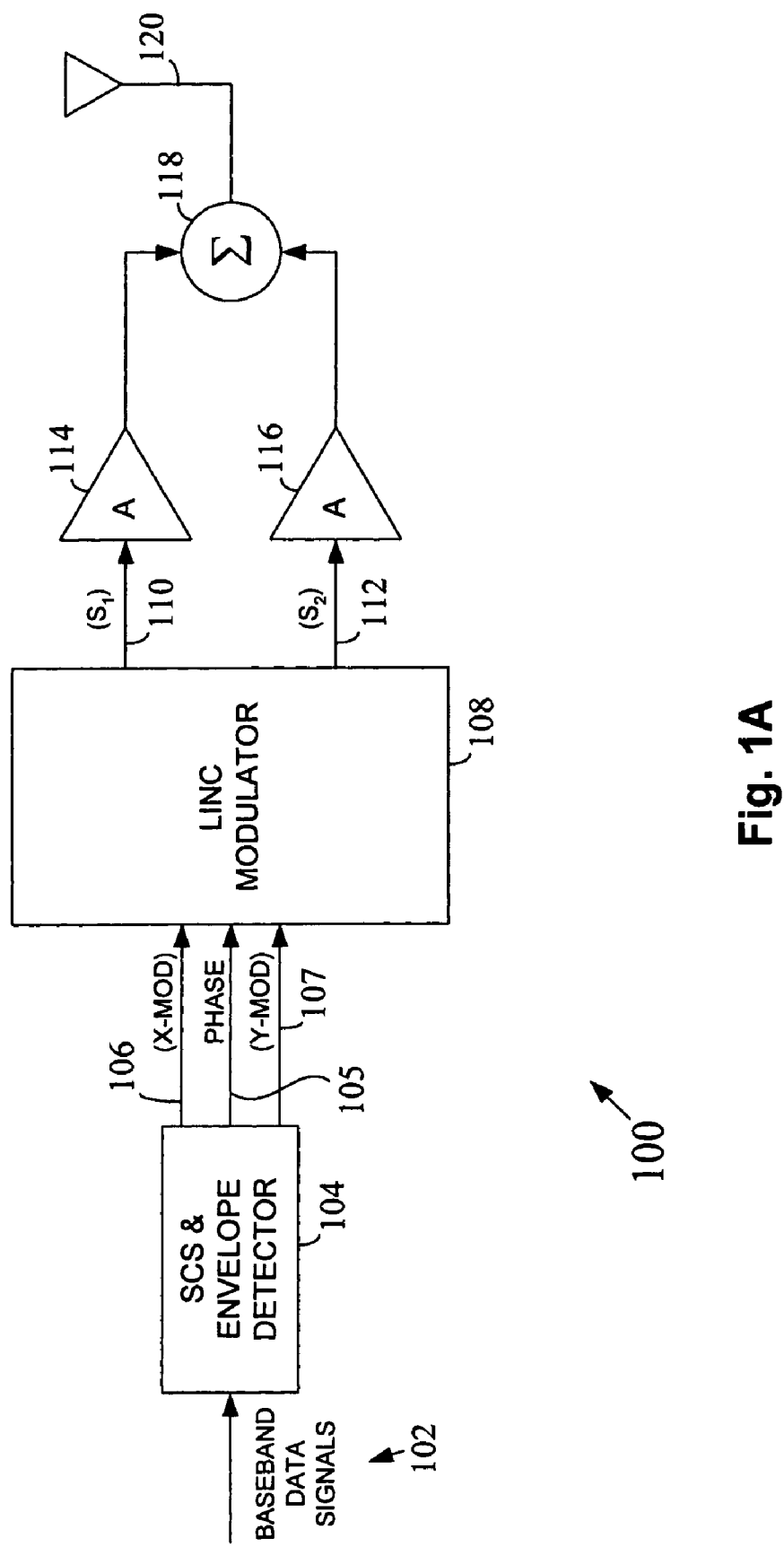
FIG. 1A is a block diagram of an example linear amplification with non-linear components (LINC) transmitter in accordance with an embodiment of the present invention.

FIG. 1A is a block diagram of a linear amplification with non-linear components (LINC) transmitter in accordance with an embodiment of the present invention. LINC transmitter 100 may transmit RF signals generated by modulating an input baseband data signal 102. LINC transmitter 100 may be used for transmitting almost any RF signal and may be part of a wireless or mobile communication device or base station. Examples of systems in which transmitter 100 may be used may include a mobile data terminal, a wireless or cellular telecommunication device, including 2.5 G and 3 G communication devices, or a portable or stationary computer with wireless communication capability. The 2.5 G and 3 G communication devices may relate to the 2.5 G and 3 G specifications released in 1999 by the 3rd Generation Partnership Project (3GPP) and subsequently amended. Transmitter 100 may also be part a personal digital assistant (PDA) or a Web tablet. In some of these embodiments, transmitter 100 may transmit over wireless links to access data networks such as an intranet, the Internet or another data network.

LINC transmitter 100 may include signal component separator (SCS) and envelope modulator element 104. Element 104 may include an SCS portion that may separate the amplitude and phase components of input baseband data signal 102. Element 104 may also include a modulator portion that may generate baseband signals 106 and 107 from the amplitude component. Phase component signal 105 may be generated from the phase component of input baseband signal 102. Baseband signals 106 and 107 may be envelope-modulated baseband signals.

LINC transmitter 100 also includes LINC modulator 108, which may RF-modulate baseband signals 106 and 107 and generate out-phased signals 110 and 112. Out-phased signals 110 and 112 may be constant-envelope phase-modulated RF signals having both the amplitude and phase components of input baseband signal 102. Both out-phased signals 110 and 112 may include the same X-axis component of the amplitude component of input baseband signal 102. Out-phased signal 110, for example, may include the +Y-axis component, while out-phased signal 112 may include the -Y-axis (minus Y) component of the amplitude component of input baseband signal 102. When in a polar representation of output modulated RF signals 110 and 112 (see FIG. 1B below), signal 106 (X-MOD) may provide the X-axis component (portion) and signal 107 (Y-MOD) may provide the Y-axis component (portion) of the amplitude component separated from input baseband signal 102. Envelope-modulated signals 106 and 107 should be distinguishable over conventional in-phase (I) and quadrature-phase (Q) representations of a baseband signal which include both the amplitude and phase components of the baseband signal.

Figure 1B:
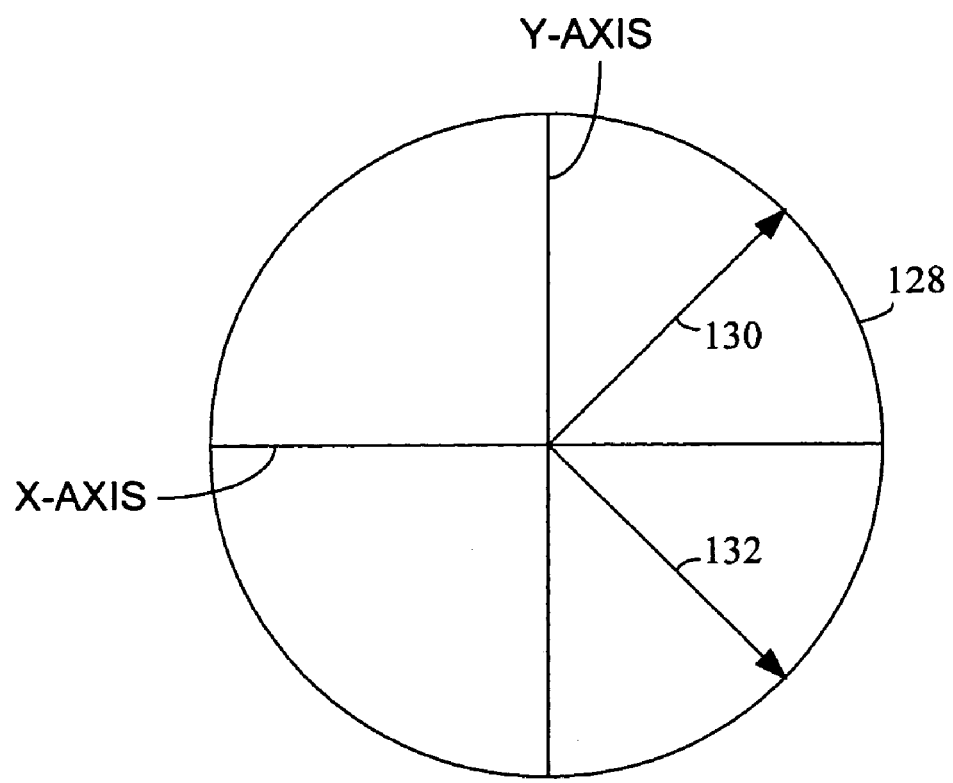
FIG. 1B is a polar representation of constant envelope RF output signals in accordance with an embodiment of the present invention.

FIG. 1B is an example polar representation of constant envelope RF output signals in accordance with an embodiment of the present invention. Vector 130 may represent RF signal 110 and vector 132 may represent RF signal 112. As can be seen, vector 130 includes substantially an X-axis component and substantially a +Y-axis component, while vector 132 includes substantially the same X-axis component and substantially the minus Y-axis component. By giving the X-Y input baseband signals (e.g., signals 106 and 107) the correct transform from the basic amplitude component of input baseband signal 102 (e.g., at the SCS), the these output vectors may move on the edge of circle 128 which represents constant envelope RF signals. Summing the RF signals produces an amplitude modulated signal. In accordance with embodiments of the present invention, vectors 130 and 132 may rotate together to maintain the phase component of input baseband signal 102.

LINC modulator 108 may modulate an RF oscillator signal with phase component signal 105 (e.g., the phase component of the input baseband signal) and generate in-phase and out-of-phase RF oscillator signals. The in-phase and out-of-phase RF oscillator signals may be respectively amplitude-modulated (AM) with envelope-modulated baseband signals 106 and 107 to generate differential current signals. The LINC modulator may sum the current signals to generate one constant-envelope signal (e.g., signal 110), and may subtract the current signals to generate the other constant-envelope signal (e.g., signal 112). Out-phased signals 110 and 112 may be respectively amplified by power amplifiers 114 and 116 before being combined by in-phase combiner 118 before transmission by antenna 120.

Amplifiers 114 and 116 may be any amplifiers or combination of amplifiers, and in embodiments, are highly-efficient, non-linear power amplifiers. In these embodiments, amplifiers 114 and 116 may operate in a switching mode for efficient operation, although this is not a requirement. Combiner 118 may be almost any power or signal combiner, and in one embodiment, combiner 118 may be a Chireix power combiner.

Antenna 120 may be any antenna suitable for transmission and/or reception of RF signals. In embodiments, antenna 120 may be a dipole antenna, a monopole antenna, a loop antenna, or a microstrip antenna, although other antenna types are also suitable.

All or part of transmitter 100 may be fabricated on a single semiconductor chip. When transmitter 100 is part of a wireless chip, or in some embodiments, part of a wireless interface card, transmitter may transmit RF signals in accordance with many various communication techniques. Examples of some suitable communication techniques may include digital and/or analog wireless communication techniques including code division multiple access (CDMA) techniques, wide band CDMA (WCDMA) techniques, or frequency division multiple access (FDMA) techniques, and/or time-division multiple access (TDMA) techniques. In some embodiments, transmitter 100 may transmit RF signals in accordance with one or more communication standards for wireless local area network (WLAN) communications, including, for example the IEEE 802.11(a), 802.11(b) and/or 802.11(g) (ANSI/IEEE 802.11, 1999, and as subsequently amended) standards for wireless local area networks, the Digital Video Broadcasting Terrestrial (DVB-T) broadcasting standard, and/or the High performance radio Local Area Network (HiperLAN) standard. In these embodiments, those of ordinary skill in the art can easily build transmitter 100 to include additional elements to perform the desired functions.

Figure 2:
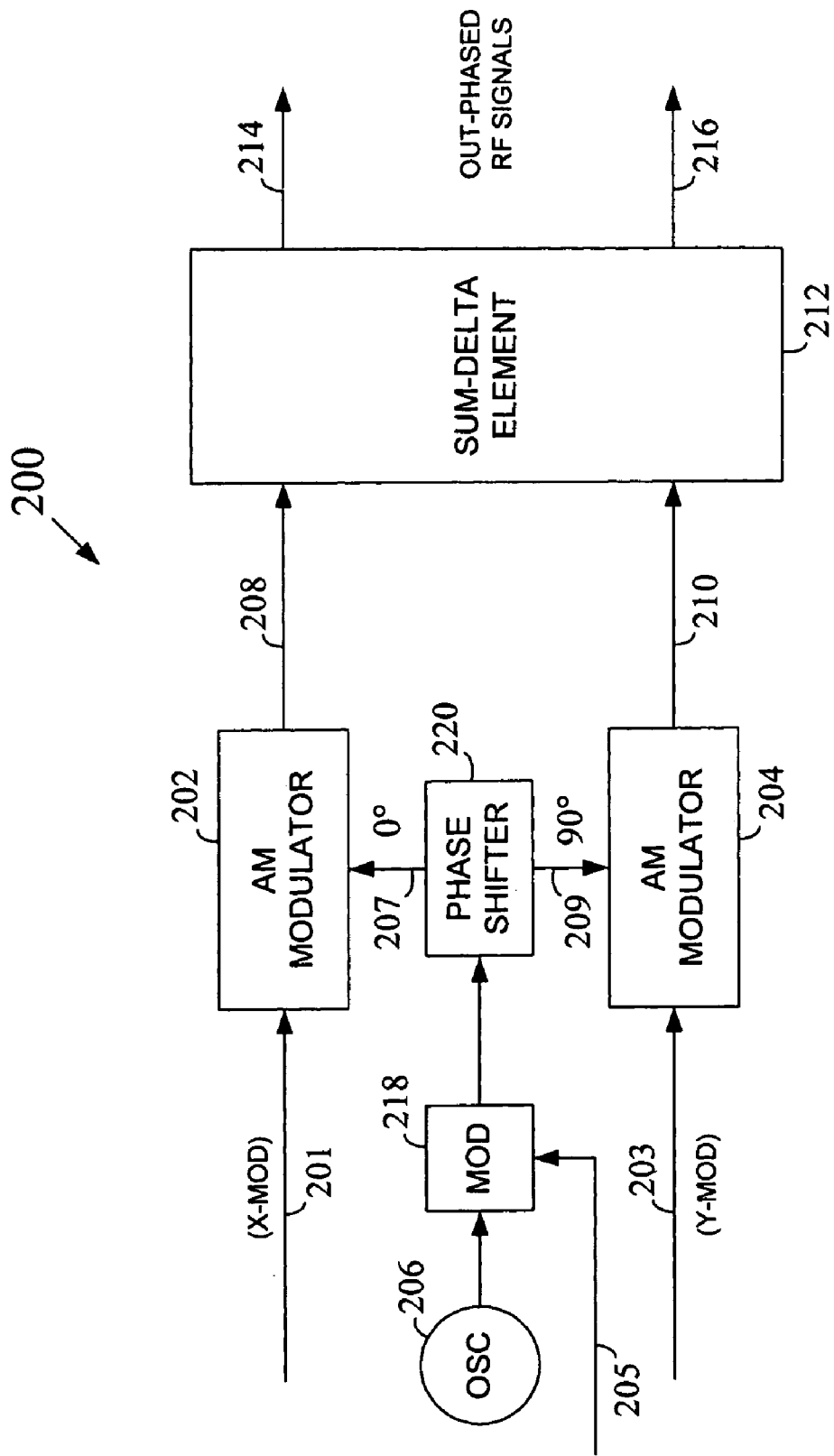
FIG. 2 is a block diagram of an example LINC modulator in accordance with an embodiment of the present invention.

FIG. 2 is a block diagram of a LINC modulator in accordance with an embodiment of the present invention. LINC modulator 200 may be suitable for use as LINC modulator 108 (FIG. 1A) although other LINC modulators may also be suitable. LINC modulator 200 receives envelope modulated baseband signals 201 and 203 from another element of a LINC transmitter, such as SCS and envelope modulator 104 (FIG. 1A). One of these envelope-modulated signals (e.g., signal 201) may correspond with baseband signal 106 (FIG. 1A) while the other envelope-modulated signal (e.g., signal 103) may correspond with baseband signal 107 (FIG. 1A).

LINC modulator 200 may include oscillator (OSC) 206 to generate an RF signal of a predetermined frequency. The RF signal may be phase-modulated in modulator 218 by phase component signal 205 and shifted substantially ninety degrees by phase shifter 220 producing in-phase RF oscillator signal 207 and out-of-phase RF signal 209. Phase component signal 205 may comprise the separated phase component of an input baseband signal and may correspond with phase component signal 105 (FIG. 1A). Oscillator 206 may be almost any oscillator for generating an RF frequency.

LINC modulator 200 may include AM modulator 202 to amplitude-modulate in-phase RF oscillator signal 207 with envelope-modulated baseband signal 201 to generate current signal 208. LINC modulator 200 may also include AM modulator 204 to amplitude-modulate out-of-phase RF oscillator signal 209 with envelope-modulated baseband signal 203 to generate current signal 210. In some embodiments, current signals 208 and 210 may be differential current signals.

LINC modulator 200 also includes sum-delta element 202 to sum current signals 208 and 210 to generate constant-envelope signal 214, and to subtract current signals 208 and 210 to generate constant-envelope signal 216. Constant-envelope signals 214 and 216 may be referred to as the out-phased RF signals. Constant-envelope signals 214 and 216 may be constant-envelope phase-modulated RF signals having both the amplitude and phase components of the input baseband signal, and may correspond respectively with RF signals 110 and 112 (FIG. 1A).

In embodiments, when constant-envelope signals 214 and 216 are represented as vectors, they would be conjugate with each other. In some embodiments, constant-envelope signals 214 and 216 may be phase and amplitude modulated, and the amplitude information may be obtained when they are combined substantially in-phase.

Although transmitter 100 (FIG. 1A) and modulator 200 are illustrated as having several separate functional elements, one or more of the functional elements may be combined and may be implemented by combinations of software configured elements, such as processing elements including digital signal processors (DSPs), and/or other hardware elements. For example, the elements may comprise one or more microprocessors, DSPs, application specific integrated circuits (ASICs), and combinations of various hardware and logic circuitry for at least performing the functions described herein.

Figure 3:
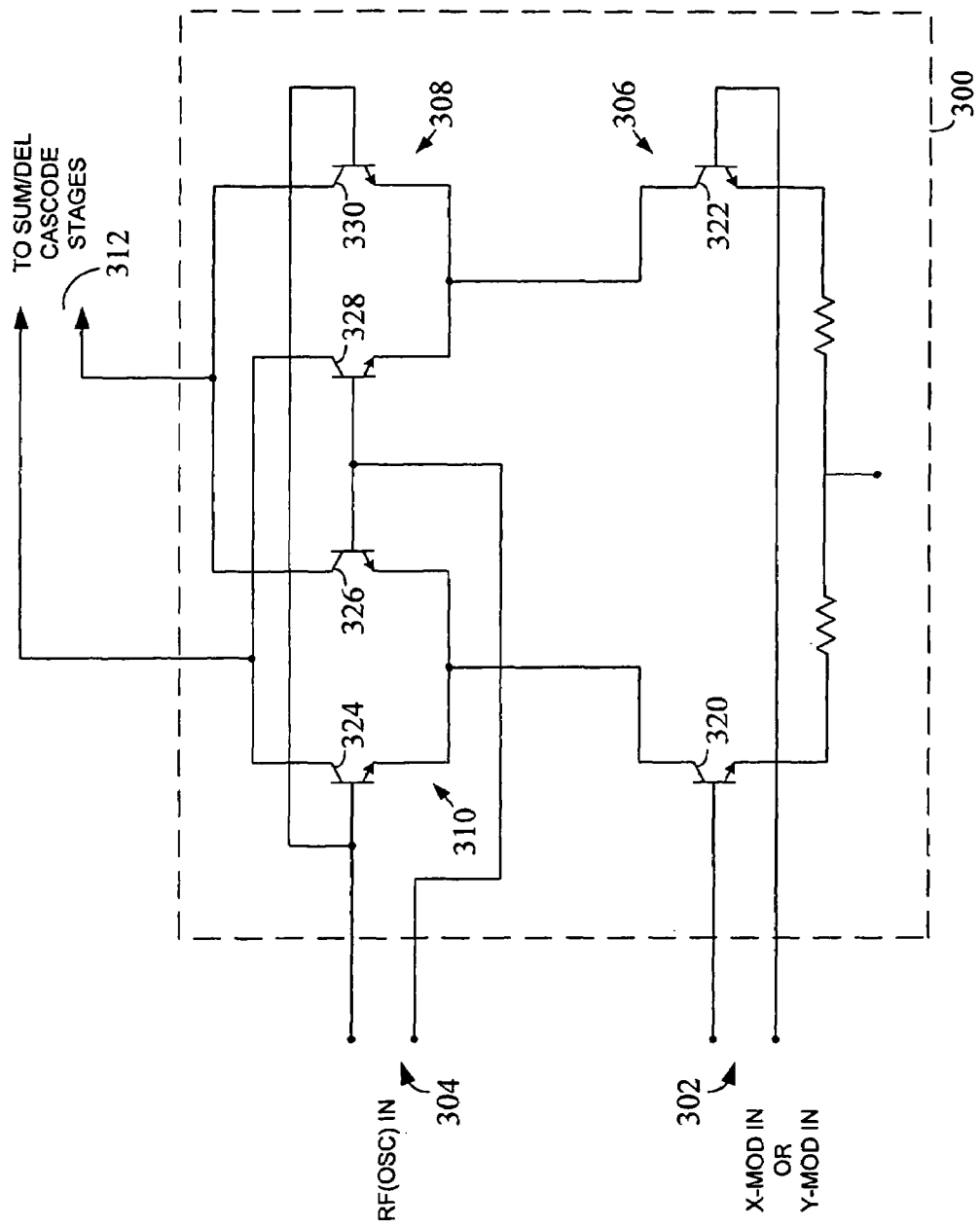
FIG. 3 is a circuit diagram of an example amplitude modulation (AM) modulator in accordance with an embodiment of the present invention.

FIG. 3 is a circuit diagram of an AM modulator in accordance with an embodiment of the present invention. AM modulator 300 may be suitable for use as AM modulator 202 (FIG. 2) and/or suitable for use as AM modulator 204 (FIG. 2) although other AM modulators may also be suitable. AM modulator 300 amplitude-modulates RF signal 304 with envelope-modulated baseband signal 302 to generate current signal 312. RF signal 304 may correspond with either in-phase RF oscillator signal 207 (FIG. 2) or out-of-phase RF oscillator signal 209 (FIG. 2) generated by oscillator 206 (FIG. 2), and current signal 312 may correspond with one of current signals 208 or 210 (FIG. 2).

AM modulator 300 may include differential pair 306 to receive envelope-modulated baseband signal 302, and differential pairs 308 and 310 coupled with differential pair 306 to receive RF signal 304 to generate current signal 312. Differential pair 306 may include switching elements 320 and 322, differential pair 308 may include switching elements 328 and 330 and differential pair 310 may include switching elements 324 and 326. Current signal 312 may be a differential current signal generated from differential pairs 308 and 310. In operation, RF signal 304 switches on and off switching elements 324-330 to generate current signal 312 at the RF frequency modulated with envelope of signal 302. In one embodiment, AM modulator 300 may use a Gilbert-cell configuration for switching elements 324-330, which combines the differential pair and current mirror concepts.

Although the embodiment illustrated in FIG. 3 shows switching elements 320-330 as NPN transistors, the switching elements may be almost any type of switching elements including PNP transistors, or field-effect transistors (FETs).

Transistors of each differential pair may be substantially identical or matched and may be formed on a single semiconductor die. In one embodiment, the corresponding switching elements of AM modulator 202 (FIG. 2) and AM modulator 204 (FIG. 2) may be substantially identical and fabricated on a single semiconductor die.

Figure 4:
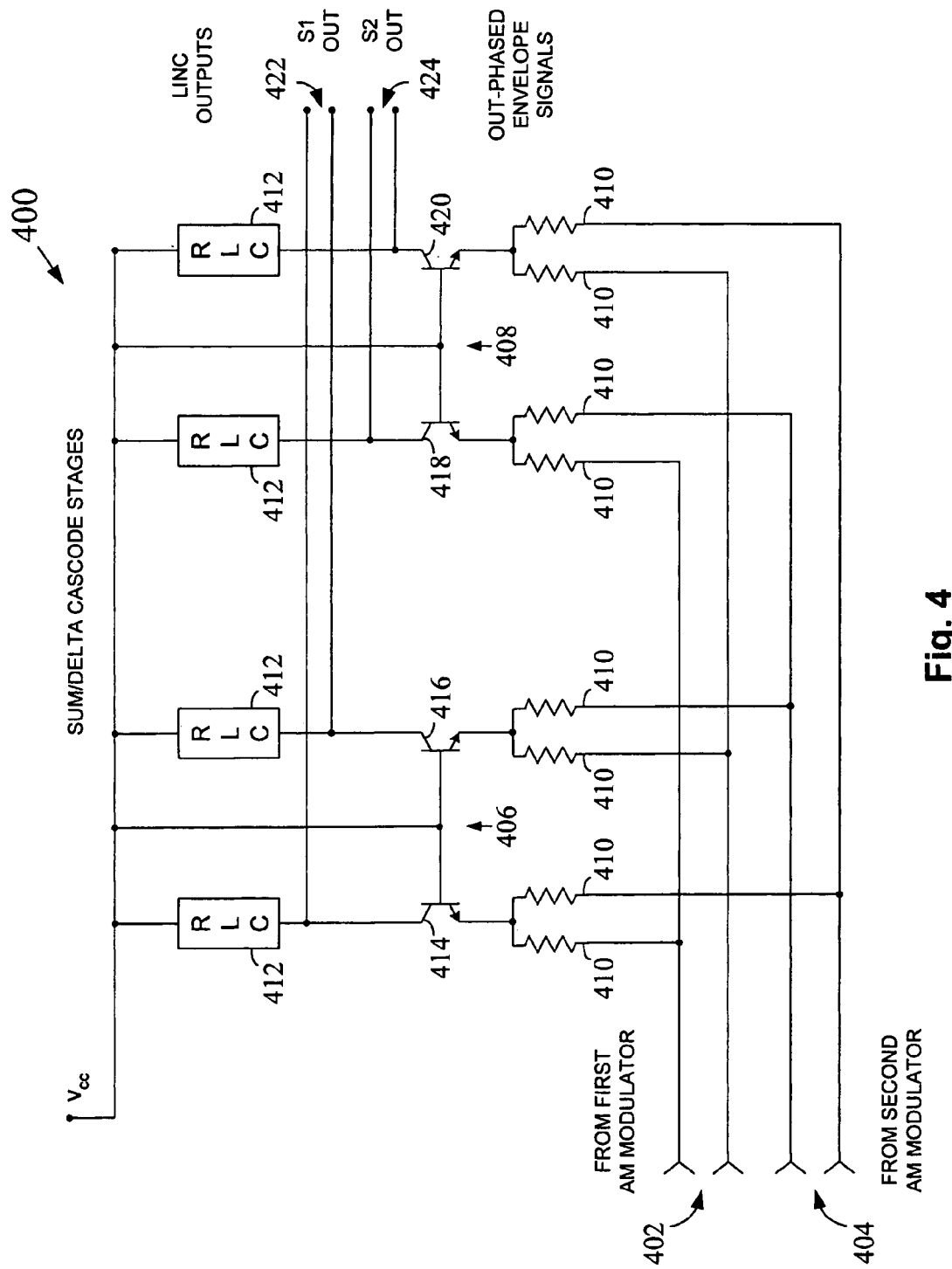
FIG. 4 is a circuit diagram of an example sum-delta element in accordance with an embodiment of the present invention.

FIG. 4 is a circuit diagram of an example sum-delta element in accordance with an embodiment of the present invention. Sum-delta element 400 may be suitable for use as sum-delta element 212 (FIG. 2) although other elements may also be suitable. Sum-delta element 400 receives current signals 402 and 404 from AM modulators and generates out-phased constant-envelope signals 422 and 424. In one embodiment, current signal 402 may correspond with current signal 208 (FIG. 2) provided by AM modulator 202 (FIG. 2) and current signal 404 may correspond with current signal 210 (FIG. 2) provided by AM modulator 204 (FIG. 2). Constant-envelope signals 422 and 424 may correspond respectively with signals 214 and 216 (FIG. 2). Current signals 402 and 404 may be differential current signals and may be provided to differential pairs 406 and 408 through resistive elements 410.

In one embodiment, differential pair 406 may comprise a set of cascoded common base transistors 414 and 416 to sum differential current signals 402 and 404 to generate constant-envelope signal 422. In this embodiment, differential pair 408 may comprise a set of cascoded common base transistors 418 and 420 to subtract differential current signals 402 and 404 to generate constant-envelope signal 424.

In embodiments, sum-delta element 400 may also include RLC circuits 412 to provide band-pass filtering to, at least in part, to increase the signal-to-noise ratio in the band of operation. The band of operation may include a frequency of in-phase and out-of-phase RF oscillator signals 207 and 209 (FIG. 2). RLC circuits 412 may be provided between the cascoded common base transistors and a supply voltage (e.g. to RF ground). In one embodiment, RLC 412 circuits may be comprised of a capacitive element in parallel with a series combination of a resistive element and an inductive element, although other combinations of elements are also suitable for filtering. In some embodiments, filtering is optional and filter circuits 412 may not be required.

Figure 5:
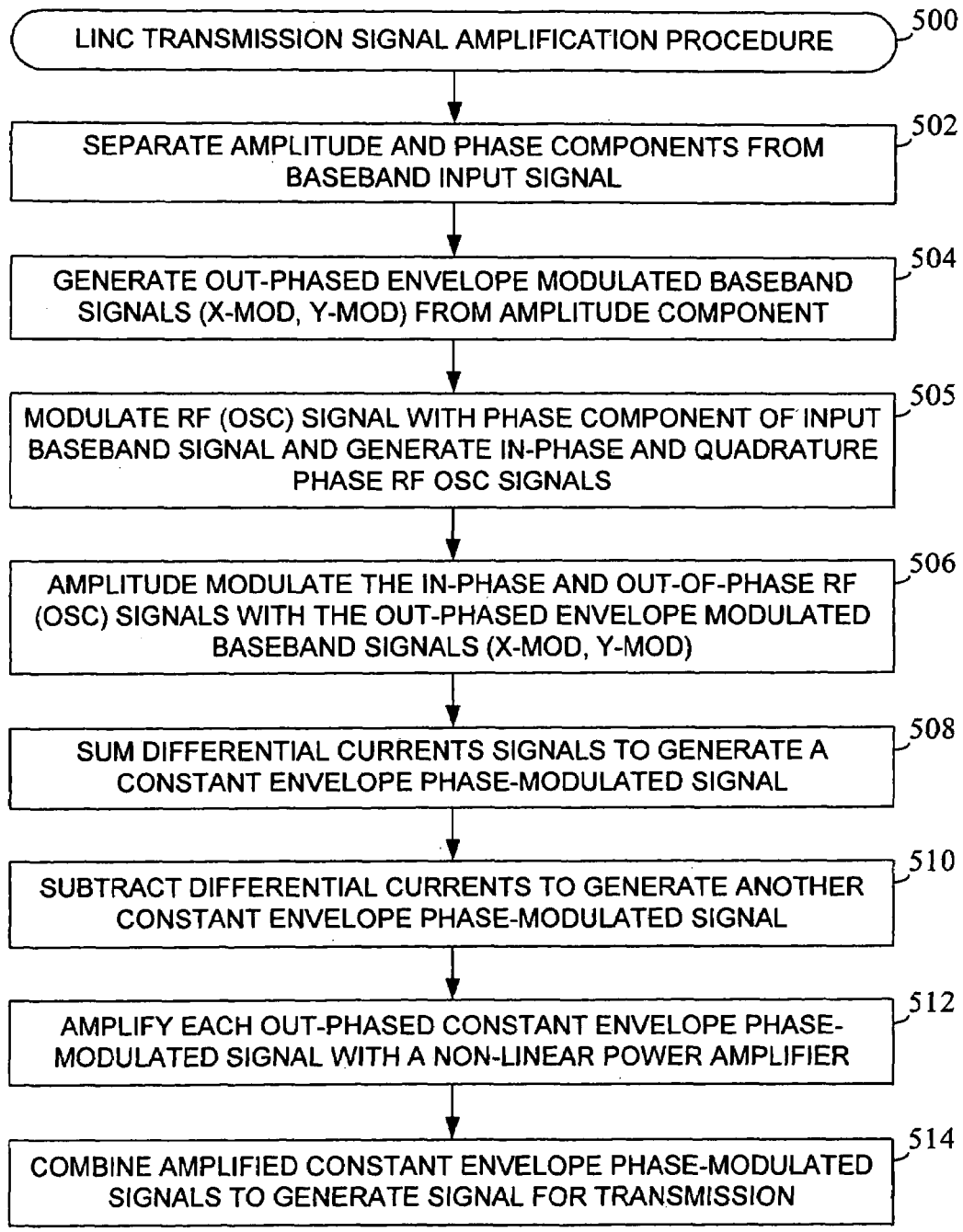
FIG. 5 is a flow chart of an example LINC transmission signal amplification procedure in accordance with an embodiment of the present invention.

FIG. 5 is a flow chart of an example LINC transmission signal amplification procedure in accordance with an embodiment of the present invention. The operations of procedure 500 may be performed by various elements of a LINC transmitter, such as LINC transmitter 100 (FIG. 1A), although other LINC transmitters may also be suitable. Procedure 500 generates an RF signal for transmission from an input baseband signal using the LINC concept.

In operation 502, amplitude and phase components are separated from an input baseband signal. In one embodiment, the envelope of these signals respectively represents the separated amplitude and phase information of the baseband data signal. A signal component separator (SCS) portion of element 104 (FIG. 1A) may be used to separate the amplitude and phase components of an input baseband signal, although other elements may be used.

In operation 504, the separated amplitude component may be used to generate envelope-modulated baseband signals. In one embodiment, the envelope modulated baseband signals generated in operation 504 may correspond with signals 106 and 107 (FIG. 1A) and may be generated by the envelope modulator portion of element 104 (FIG. 1A) although other elements may be used to generate envelope modulated baseband signals from an amplitude component of an input baseband data signal.

In operation 505, an RF oscillator signal is modulated with the phase component separated from the input baseband signal in operation 502. Operation 505 may also include generating in-phase and out-of-phase modulated RF oscillator signals by phase-shifting the modulated RF oscillator signal. In one embodiment, oscillator 206 (FIG. 2) may be used to generate an RF signal, modulator 218 (FIG. 2) may be used to modulate the RF signal with phase component signal 205 (FIG. 2) of the input baseband signal, and phase shifter 220 (FIG. 2) may be used to phase shift the modulated RF oscillator signal to generate in-phase RF oscillator signal 207 and out-of-phase RF oscillator signal 209.

In operation 506, the in-phase and out-of-phase RF oscillator signals (e.g., signals 207 and 209 (FIG. 2)) may be amplitude-modulated, respectively, with the envelope-modulated baseband signals (e.g., signals 201 and 203 (FIG. 2)) to generate, respectively, current signals (e.g., signals 208 and 210). In one embodiment, operation 506 may be performed by AM modulators 202 and 204 (FIG. 2) although other modulators may also be used. In one embodiment, one of the envelope-modulated baseband signal may be used to amplitude-modulate the in-phase RF oscillator signal in one AM modulator to generate one differential current signal, while the other envelope-modulated baseband signal may be used to modulate the out-of-phase RF oscillator signal to generate another differential current signal.

In operation 508, the current signals from operation 506 may be summed to generate a constant-envelope phase-modulated signal. The constant-envelope phase-modulated signal generated in operation 508 may correspond, for example, with out-phased signal 110 (FIG. 1A). In operation 510, the differential current signals from operation 506 may be subtracted to generate another constant-envelope phase-modulated signal. The constant-envelope phase-modulated signal generated in operation 510 may correspond, for example, with out-phased signal 112 (FIG. 1A). Out-phased signals 110 and 112 may be constant-envelope phase-modulated RF signals having both the amplitude and phase components of the input baseband signal.

Operation 512 may separately amplify the constant-envelope phase-modulated signals generated in operations 508 and 510 with non-linear power amplifiers, such as amplifiers 114 and 116 (FIG. 1A). The power amplifiers may be operated in a switching mode for enhanced efficiency.

Operation 514 combines the amplified constant-envelope phase-modulated signals from operation 512 to generate a signal for transmission. In one embodiment, operation 514 may perform an in-phase combining of the constant-envelope phase-modulated signals 214 and 216 (FIG. 2). In this embodiment, combiner 118 may be used to perform operation 514.

Although the individual operations of procedure 500 are illustrated and described as separate operations, one or more of the individual operations may be performed concurrently and nothing requires that the operations be performed in the order illustrated.

Thus, embodiments of an improved LINC transmitter and an improved LINC modulator have been described. Methods for generating out-phased signals for use in a LINC transmitter have also been described. In the embodiments, out-phased signals may be produced with the use of less die area and with reduced current consumption.

The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, the invention embraces all such alternatives, modifications, equivalents and variations as fall within the spirit and scope of the appended claims.

What is claimed is:

1. A linear amplification with non-linear components (LINC) modulator comprising:
    a first modulator to amplitude-modulate an in-phase RF oscillator signal with a first envelope-modulated baseband signal to generate a first differential current signal;
    a second modulator to amplitude-modulate an out-of-phase RF oscillator signal with a second envelope-modulated baseband signal to generate a second differential current signal; and
    a sum-delta element to sum the current signals from the first and second modulators to generate a first constant-envelope signal and to subtract the current signals from the first and second modulators to generate a second constant-envelope signal;
    wherein the first modulator comprises:
        a first differential pair of transistors to receive the first envelope-modulated baseband signal; and
        second and third differential pairs of transistors coupled with the first differential pair to receive the in-phase RF signal and to generate the first differential current signal.

2. The LINC modulator of claim 1 wherein:
    the first envelope-modulated baseband signal provides X-axis components of both the first and second constant-envelope signals;
    the second envelope-modulated baseband signal provides positive and negative Y-axis components of both constant-envelope modulated signals;
    the first constant envelope signal includes substantially the positive Y-axis component;
    the second constant-envelope signal includes substantially the negative Y-axis component;
    the first and second constant envelope signals include substantially the same X-axis components; and
    the in-phase and out-of-phase RF oscillator signals are modulated with a separated phase component of the input baseband data signal.

3. The LINC modulator of claim 1 further comprising:
    an oscillator to generate an RF oscillator signal;
    a modulator to modulate the RF oscillator signal with a separated phase component of an input baseband data signal; and
    a phase shifter to generate the in-phase and out-of-phase RF oscillator signals from the modulated RF oscillator signal.

4. The LINC modulator of claim 1 wherein the second AM modulator comprises:
    a fourth differential pair of transistors to receive the second envelope-modulated baseband signal; and
    a fifth and sixth differential pairs of transistors coupled with the fourth differential pair to receive the out-of-phase RF signal and to generate the second differential current signal.

5. The LINC modulator of claim 4 wherein the sum-delta element comprises:
    a first set of cascoded common base transistors to sum the first and second differential current signals to generate the first constant-envelope signal; and
    a second set of cascoded common base transistors to subtract the first and second differential current signals to generate the second constant-envelope signal.

6. The LINC modulator of claim 4 wherein the sum-delta element further comprises RLC circuits between the cascoded common base transistors and RF ground to improve signal-to-noise performance within an RF band of operation.

7. The LINC modulator of claim 4 wherein the sum-delta element further comprises resistive elements to couple the differential current signals from the AM modulators with the common base transistors, the resistive elements isolating outputs of the second, third, fifth and sixth differential pairs.

8. The LINC modulator of claim 1 wherein the first and second constant-envelope signals are phase-modulated signals which are subsequently amplified by non-linear power amplifiers and combined to generate an RF transmit signal for transmission by an antenna.

9. The LINC modulator of claim 8 wherein the amplitude component is separated from a phase component of the input baseband signal, and wherein both the first and second constant-envelope signals include the phase component of the input baseband signal.

10. A method of generating out-phased constant-envelope phase-modulated signals comprising:
    amplitude modulating an in-phase RF oscillator signal with a first envelope-modulated baseband signal to generate a first differential current signal;
    amplitude modulating an out-of-phase RF oscillator signal with a second envelope-modulated baseband signal to generate a second differential current signal; and
    summing the first and second differential current signals to generate a first constant-envelope signal; and
    subtracting the first and second differential current signals to generate a second constant-envelope signal;
    wherein amplitude modulating an in-phase RF oscillator signal includes:
        applying said first envelope-modulated baseband signal to a first differential pair of transistors; and
        applying said in-phase RF oscillator signal to second and third differential pairs of transistors, that are coupled to said first differential pair of transistors, said second and third differential pairs of transistors to output said first differential current signal.

11. The method of claim 10 wherein prior to amplitude modulating, the method comprises:
    separating amplitude and phase components of an input baseband data signal;
    generating the first and second envelope-modulated baseband signals from the amplitude component of the input baseband data signal.

12. The method of claim 11 wherein:
    the first envelope-modulated baseband signal provides X-axis components of both the first and second constant-envelope signals;
    the second envelope-modulated baseband signal provides positive and negative Y-axis components of both the first and second constant-envelope modulated signals;
    the first constant envelope signal includes substantially the positive Y-axis component; and
    the second constant-envelope signal includes substantially the negative Y-axis component,
    the in-phase and out-of-phase RF oscillator signals are modulated with a separated phase component of the input baseband data signal.

13. The method of claim 11 wherein prior to amplitude modulating, further comprising:
modulating an RF oscillator signal with the separated phase component of the input baseband signal; and
phase shifting the modulated RF oscillator signal to generate the in-phase and out-of-phase RF oscillator signals.

14. The method of claim 13 further comprising:
power amplifying the first and second constant-envelope signals; and
in-phase combining the amplified first and second constant-envelope signals for transmission.

15. A transmitter comprising:
a signal component separator and baseband envelope modulator element to separate amplitude and phase components of an input baseband signal and to convert the amplitude component to first and second envelope-modulated baseband signals; and
a LINC modulator comprising:
a first modulator to amplitude-modulate an in-phase RF oscillator signal with the first envelope-modulated baseband signal to generate a first differential current signal;
a second modulator to amplitude-modulate an out-of-phase RF oscillator signal with the second envelope-modulated baseband signal to generate a second differential current signal; and
a sum-delta element to sum the current signals from the first and second modulators to generate a first constant-envelope signal and to subtract the current signals from the first and second modulators to generate a second constant-envelope signal;
wherein the first modulator comprises:
a first differential pair of transistors to receive the first envelope-modulated baseband signal; and
second and third differential pairs of transistors coupled with the first differential pair to receive the in-phase RF signal and to generate the first differential current signal.

16. The transmitter of claim 15, wherein:
the first envelope-modulated baseband signal provides X-axis components of both first and second constant-envelope signals;
the second envelope-modulated baseband signal provides positive and negative Y-axis components of both the first and second constant-envelope modulated signals;
the first constant envelope signal includes substantially the positive Y-axis component; and
the second constant-envelope signal includes substantially the negative Y-axis component.

17. The transmitter of claim 16 further comprising:
a first non-linear power amplifier to amplify the first constant-envelope phase-modulated signal; and
a second non-linear power amplifier to amplify the second constant-envelope phase-modulated signal.

18. The transmitter of claim 17 further comprising a combiner to combine the amplified first and second constant-envelope phase-modulated signals before transmission.

19. The transmitter of claim 15 wherein the LINC modulator comprises:
an oscillator to generate an RF oscillator signal;
a modulator to modulate the RF oscillator signal with the separated phase component of the input baseband data signal; and
a phase shifter to generate in-phase and out-of-phase RF oscillator signals from the modulated RF oscillator signal.

20. The transmitter of claim 15 wherein:
the second modulator comprises:
a fourth differential pair of transistors to receive the second envelope-modulated baseband signal; and
fifth and sixth differential pairs of transistors coupled with the fourth differential pair to receive the out-of-phase RF signal and to generate the second differential current signal.

21. The transmitter of claim 15 wherein the sum-delta element comprises:
a first set of cascoded common base transistors to sum the first and second differential current signals to generate the first constant-envelope signal; and
a second set of cascoded common base transistors to subtract the first and second differential current signals to generate the second constant-envelope signal.

22. A wireless communication device comprising:
a transmitter to generate an RF signal for transmission; and
a dipole antenna to transmit the RF signal generated by the transmitter;
wherein the transmitter includes a LINC modulator to amplitude-modulate first and second envelope modulated baseband signals and generate out-phased constant-envelope phase-modulated RF signals, the out-phased constant-envelope phase-modulated RF signals to be amplified and combined before transmission, said LINC modulator comprising:
a first modulator to amplitude-modulate an in-phase RF oscillator signal with the first envelope-modulated baseband signal to generate a first differential current signal;
a second modulator to amplitude-modulate an out-of-phase RF oscillator signal with the second envelope-modulated baseband signal to generate a second differential current signal; and
a sum-delta element to sum the current signals from the first and second modulators to generate a first constant-envelope signal and to subtract the current signals from the first and second modulators to generate a second constant-envelope signal;
wherein the first modulator comprises:
a first differential pair of transistors to receive the first envelope-modulated baseband signal; and
second and third differential pairs of transistors coupled with the first differential pair to receive the in-phase RF signal and to generate the first differential current signal.

23. The wireless communication device of claim 22 wherein:
the first envelope-modulated baseband signal provides X-axis components of first and second constant-envelope signals;
the second envelope-modulated baseband signal provides positive and negative Y-axis components of both the first and second constant-envelope modulated signals;
the first constant envelope signal includes substantially the positive Y-axis component; and
the second constant-envelope signal includes substantially the negative Y-axis component;
wherein the in-phase and out-of-phase RF oscillator signals are modulated with a separated phase component of the input baseband data signal.

24. The wireless communication device of claim 23 wherein the transmitter comprises:
- a signal component separator and baseband envelope modulator element to separate amplitude and phase components of the input baseband signal and to convert the amplitude component to the envelope modulated baseband signals;
- a first non-linear power amplifier to amplify the first constant-envelope phase-modulated signal;
- a second non-linear power amplifier to amplify the second constant-envelope phase-modulated signal; and
- a combiner to combine the amplified first and second constant-envelope phase-modulated signals before transmission.

25. The wireless communication device of claim 24, wherein the LINC modulator comprises:
- an oscillator to generate an RF oscillator signal;
- a modulator to modulate the RF oscillator signal with the separated phase component of the input baseband data signal; and
- a phase shifter to generate in-phase and out-of-phase RF oscillator signals from the modulated RF oscillator signal.

26. The wireless communication device of claim 22, wherein the sum-delta element comprises:
- a first set of cascoded common base transistors to sum the first and second differential current signals to generate the first constant-envelope signal; and
- a second set of cascoded common base transistors to subtract the first and second differential current signals to generate the second constant-envelope signal.

* * * * *